(12) United States Patent
Konishi et al.

(10) Patent No.: US 8,106,195 B2
(45) Date of Patent: Jan. 31, 2012

(54) POLYMER AND COMPOSITIONS

(75) Inventors: Toru Konishi, Tsukuba (JP); Noboru Maejima, Tokyo (JP); Makiya Ito, Tsukuba (JP)

(73) Assignee: Cytec Surface Specialties, S.A., Brussels (BE)

( * ) Notice: Subject to any disclaimer, the term of this patent is extended or adjusted under 35 U.S.C. 154(b) by 906 days.

(21) Appl. No.: 11/991,503

(22) PCT Filed: Oct. 25, 2006

(86) PCT No.: PCT/EP2006/010265
§ 371 (c)(1),
(2), (4) Date: Apr. 3, 2008

(87) PCT Pub. No.: WO2007/048586
PCT Pub. Date: May 3, 2007

(65) Prior Publication Data
US 2009/0043095 A1    Feb. 12, 2009

(30) Foreign Application Priority Data
Oct. 25, 2005 (EP) .................................. 05023240

(51) Int. Cl.
C07D 251/32 (2006.01)
C07D 251/34 (2006.01)
C09D 175/16 (2006.01)
C08G 18/67 (2006.01)
G03F 7/027 (2006.01)

(52) U.S. Cl. ...................... 544/221; 544/222; 430/284.1
(58) Field of Classification Search .................. 544/221, 544/222; 430/284.1; 522/98
See application file for complete search history.

(56) References Cited

U.S. PATENT DOCUMENTS
5,952,154 A    9/1999   Barr et al.
6,319,653 B1   11/2001  Barr

FOREIGN PATENT DOCUMENTS
CA    2 189 836    6/1997

*Primary Examiner* — Venkataraman Balasubramanian
(74) *Attorney, Agent, or Firm* — Wenderoth, Lind & Ponack, L.L.P.

(57) ABSTRACT

There are disclosed urethane acrylates of Formula 1:

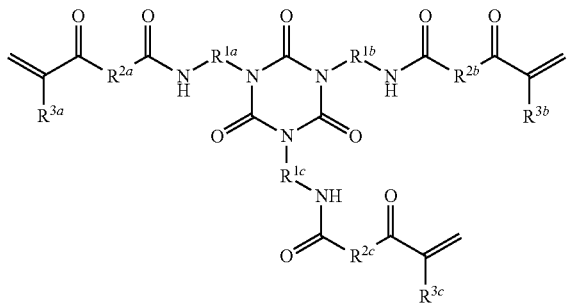

where $R^{1a}$, $R^{1b}$ and $R^{1c}$ each independently represent $C_{2-15}$hydrocarbylene, preferably linear $C_{3-12}$alkylene (such as, $C_{4-8}$alkylene; e.g. hexylene); a isophorone unit and/or a tolyl unit. $R^{2a}$, $R^{2b}$ and $R^{2c}$ each independently represent: a divalent moiety of

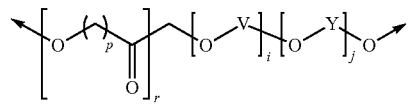

(Formula 2) where X and Y independently represent $C_{2-10}$hydrocarbylene, preferably $C_{2-8}$alkylene; and k is from 0 to 30; l is from 0 to 30; and 'k+l' is from 1 to 30; and/or a divalent moiety of Formula 3

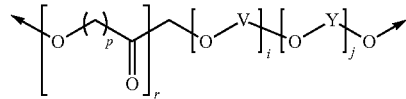

where V and W independently represent $C_{2-10}$hydrocarbylene, preferably $C_{2-8}$alkylene; and i is from 0 to 30; j is from 0 to 30; and 'i+j' is from 1 to 30; p is from 1 to 10; and r is from 1 to 10; and $R^{3a}$ $R^{3b}$ and $R^{3c}$ each independently represent H or methyl (i.e. $R^3$ forms respectively part of an acrylate or a methacrylate group); with the provisos that at least one of $R^{2a}$, $R^{2b}$ and $R^{2c}$ is a moiety of Formula 2; at least one of $R^{2a}$, $R^{2b}$ and $R^{2c}$ is a moiety of Formula 3; and when $R^2$ represents a divalent moiety of Formula 3, the sub moiety

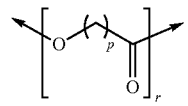

within Formula 3, is attached directly to the amide group in Formula 1. The UAs of Formula 1 are of non crystalline and of low viscosity and are suitable for preparing polymeric flexibilizers suitable for tenting applications. A process for preparing these urethane acrylate is also described.

8 Claims, No Drawings

POLYMER AND COMPOSITIONS

This invention relates to the field of urethane acrylate resins curable by actinic radiation such as UV radiation and/or e-beam.

Urethane acrylates are conveniently used to prepare radiation curable resin compositions for use as flexibilisers, plasticizers and/or softeners. Often such urethane acrylates comprise isocyanurate groups.

However most of the conventional urethane acrylates have various disadvantages for use in the aforementioned applications, especially when used in tenting applications.

As used herein the term "tenting" refers to the following process for producing circuit boards. In a first step a dry film of photo-curable resin (known as a photo-resist) is applied to a laminate clad in copper foil. In a second step, curing (usually UV) radiation is applied to the coated laminate through a negative image of the circuit to be produced. The photo-resist is thus cured only in those areas that correspond to the desired circuit. In the next, development, step the substrate is dipped into developer or etchant and the copper foil will be removed where it is not protected by cured photo-resist. The photo-resist is removed (stripped) in a final step to reveal the underlying copper circuit.

However if the photo-resist does not have sufficiently good tenting properties then copper foil will not be sufficiently protected from the developer. In a worse case breaks will appear in the circuit will make the board unusable and even holes in desired pattern may have other undesirable effects (such as a undesirable change in the electrical properties of the circuit). It is also desirable in tenting applications for the photo resist to have sufficient flexibility to be easy to apply and use as well as to provide improved resistance to development to protect of the circuit image. This can be achieved by use of flexibilisers, softeners and/or plasticizers and/or improving the inherent properties of the photo-resist.

The disadvantages of known urethane acrylates include some or all of the following. The urethane acrylates develop scum in the polymer composition and/or are too highly crystalline. If di-functional urethane acrylates are used the compositions are too soft but if highly functional urethane acrylates are used the resin is too brittle. Modifying the urethane acrylate to address these issues can result in the polymer composition losing robust tenting strength.

Various isocyanurate based urethane acrylates are known, for example those described below.

JP 57-55914-A (Hitachi Chem.) discloses urethane acrylate containing dry film photo-resist composition for solder masks and/or plating resists. However, those urethane acrylates have good chemical and/or thermal resistance but poor tenting strength.

JP 59-157112 discloses the comparative examples herein (see below) with poly caprolactone modifications.

JP 62-050315 discloses PTMG based urethane acrylates.

JP 62-215618 discloses urethane acrylates from polyisocyanate/polyetherpolyol/monohydroxyalkylacrylate combination with THEIC tri(meth)acrylates and monofunctional (meth)acrylates.

JP 62-290705 discloses solder resist formulation including THEIC tri(meth)acrylates, PPG or PEG based urethane (meth)acrylates JP 63-027518 describes PTMG/H12MDI based urethane acrylates.

JP 63-090525 discloses urethane acrylates from polyisocyanate/polyetherpolyol/monohydroxyalkylacrylate/HO—$R^1$—S—$R^2$—OH (where $R^1$ and $R^2$ denote alkyl chains).

JP 63-090526 describes urethane acrylate from polyisocyanate/polyesterpolyol ($M_w$ 600-4000)/diol ($M_w$ 60-200)/monohydroxyalkylacrylate. The following structures are those exemplified TDI/polyesterpolyol ($M_w$ 1000)/1,4-butanediol or 1,6-hexanediol or 3-methyl-1,6-pentanediol/HEA.

JP 63-270719 discloses PTMG based urethane acrylates.

JP 02-034620 discloses (a) urethane (meth)acrylates (b) mono and multi functional unsaturated compounds (c) phosphineoxide derivatives as photo initiators. The following three types of urethane acrylates are the only ones exemplified (i) HEA/TDI/PTMG #1000/TDI/HEA (ii) HPA/HDI/PTMG #2000/HDI/HPA and (iii) HEA/TDI/PPG, PTMG copolymer #2000/TDI/HEA.

JP 04-130119 describes materials similar to the comparative examples described later in this application.

JP 04-306218 describes polyisocyanate mixture having isocyanurate structure and allophanate structure by reacting with HDI or HDI/IPDI and $C_{6-9}$ aliphatic alcohol. There is no radiation curable functional group within the claimed structures.

JP 05-117348 discloses TDI based urethane acrylates for high refractive index.

JP 05-273754-A (Sunopco) discloses isocyanurate based urethane acrylate having chemical and thermal resistances for liquid photo-imageable solder masks.

JP 06-093066 also discloses UV-PUD compounds.

JP 06-145273 discloses UV-PUD compounds.

JP 09-003147 describes polyisocyanate hardener, polyisocyanate modified paint and adhesive formulations by using HDI/IPDI blends partially reacted with primary alcohol. There is no radiation curable functional group within the claimed structures.

JP 09-087338 discloses poly organosiloxane based urethane acrylates.

JP 2001-117224-A (Hitachi Chem); JP 2001-174988-A (Hitachi Chem); JP 2002-196484-A (Hitachi Chem); and JP 2002-207292-A (Hitachi Chem.) each disclose dry film photo resist compositions for tenting applications. The compositions comprise urethane acrylate(s) with alkylene oxide units added which are stated to improve tenting performance. However, these compositions remain insufficiently improved to satisfy current industrial requirements.

It is an object of the present invention to provide improved urethane acrylates and polymer compositions obtainable therefrom which solve some or all of these problems described herein.

The applicant has found surprisingly that if certain urethane acrylates with isocyanurate groups also comprise polycaprolactone and polyethylene glycol moieties they are especially suitable for preparing polymer compositions with excellent tenting properties as these urethane acrylates are non crystalline and have low viscosity.

Therefore broadly in accordance with the present invention there is provided a urethane acrylate represented by Formula 1:

Formula 1

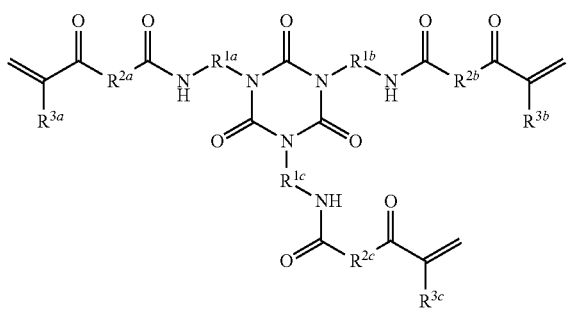

where
$R^{1a}$, $R^{1b}$ and $R^{1c}$ each independently represent $C_{2-15}$hydrocarbylene;
$R^{2a}$, $R^{2b}$ and $R^{2c}$ each independently represent:
a divalent moiety of Formula 2

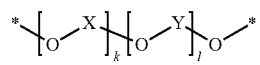

Formula 2 where X and Y independently represent $C_{2-10}$hydrocarbylene, preferably $C_{2-8}$alkylene; and
k is from 0 to 30; l is from 0 to 30; and 'k+l' is from 1 to 30;
and/or
a divalent moiety of Formula 3

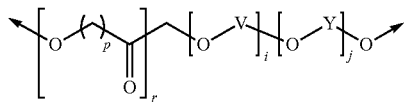

where V and W independently represent $C_{2-10}$hydrocarbylene, preferably $C_{2-8}$alkylene; and
i is from 0 to 30; j is from 0 to 30; and 'i+j' is from 1 to 30;
p is from 1 to 10; and
r is from 1 to 10;
$R^{3a}$ $R^{3b}$ and $R^{3c}$ each independently represent H or methyl (i.e. $R^3$ forms respectively part of an acrylate or a methacrylate group);
with the provisos that:
at least one of $R^{2a}$, $R^{2b}$ and $R^{2c}$ is a moiety of Formula 2;
at least one of $R^{2a}$, $R^{2b}$ and $R^{2c}$ is a moiety of Formula 3; and
when $R^2$ represents a divalent moiety of Formula 3, the sub-moiety

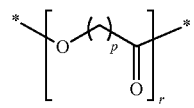

within Formula 3, is attached directly to the amide group in Formula 1.
Preferably $R^{1a}$, $R^{1b}$ and $R^{1c}$ each independently represent a linear $C_{2-15}$alkylene, and/or a $C_{3-15}$hydrocarbylene comprising a cyclic ring.
More preferably the linear alkylene is $C_{3-12}$alkylene, most preferably $C_{4-8}$alkylene; for example hexylene.
Most preferably the cyclic hydrocarbylene is a moiety of Formula 4:

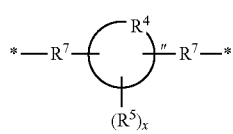

Formula 4 where $R^4$ denotes a $C_{3-8}$hydrocarbylene ring (optionally a $C_6$hydrocarbylene ring, for example phenylene or cyclohexylene);

$R^5$ is independently $C_{1-4}$alkyl; and x is 0 to 4 (optionally $R^5$ is methyl and x is 1 to 3); and $R^6$ and $R^7$ independently represent methylene or a direct bond (i.e. where the moiety is attached within Formula 1 via a single bond directly to the ring of Formula 4).

Most preferably the cyclic hydrocarbylene is selected from the group consisting of: isophorone unit(s) and tolyl unit(s).

The term isophorone unit as used herein means any suitable divalent group derived from isophorone. Suitable isophorone units may comprise for example the moiety

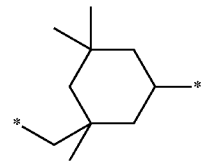

(which may be derived from any suitable precursors such as isophorone diisocyanate

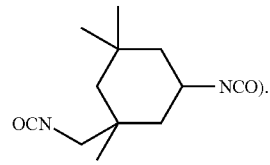

The term tolyl unit as used herein means any suitable divalent group derived from toulene. Suitable tolyl units may comprise for example the moieties

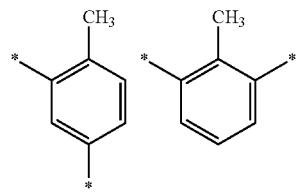

(which may be derived from any suitable precursors such as suitable isomers of tolylene diisocyanurete (TDI), respectively

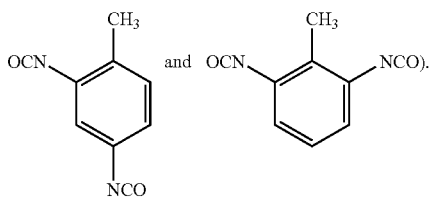

The terms isophorone unit and tolyl unit includes any suitable isomers thereof as the atoms on these moieties which are linked to the rest of the structure of Formula 1 cannot always be readily controlled during the preparation of these urethane acrylates.

$R^2$ may represent a divalent moiety of Formula 3 that comprises a sub-moiety of formula

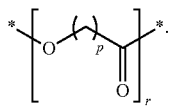

As the second proviso makes clear, these sub-moiet(ies) are never attached directly to (meth)acrylate functional group in Formula 1, but the other way round (to the amide). When $R^2$ is a moiety of Formula 3, it is the

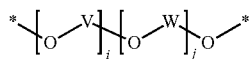

moiety within Formula 3 which would be connected directly to the (meth)acrylate group in Formula 1.

Preferred moieties of Formula 2 are those where: k is from 0 to 20; l is from 0 to 20 and 'k+l' is from 1 to 20; more preferably where k is from 0 to 10; l is from 0 to 10 and 'k+l' is from 6 to 10, most preferably where X and Y are also linear or branched alkylene.

Conveniently Formula 2 is a divalent moiety of Formula 2a

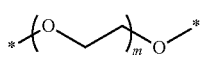

Formula 2a where m is from 2 to 12, more conveniently from 5 to 12, most conveniently from 6 to 10. (i.e. Formula 2a corresponds to Formula 2 above where X and Y are both ethylene and k+l=m)

Preferred moieties of Formula 3 are those where:
i is from 0 to 20; j is from 0 to 20, and 'i+j' is from 1 to 20; and r is from 1 to 8; and p is from 3 to 6.

More preferred moieties of Formula 3 are those where:
i is from 0 to 10; j is from 0 to 10 and 'i+j' is from 1 to 10; and r is from 1 to 6; and p is from 3 to 6.

Most preferred moieties of Formula 3 are those where:
i is from 0 to 4; j is from 0 to 4, and 'i+j' is from 1 to 4;
r is from 2 to 4 and p is 4; and
V and W are both non cyclic $C_{2-4}$alkylene.

Conveniently Formula 3 is a divalent moiety of Formula 3a

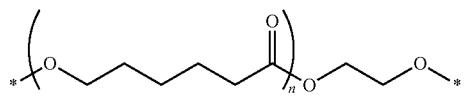

Formula 3a where n is from 1 to 8, more conveniently from 1 to 5; most conveniently from 2 to 4. (i.e. Formula 3a corresponds to Formula 3 above where i is 0, j is 1, W is ethylene, p is 5 and r is n)

The applicant has discovered that urethane acrylates (UA) comprising predominately linking groups of Formula 3 (such as those UA represent by an analogy of Formula 1 where every $R^2$ represents a moiety of Formula 3a comprising 'n' caprolactone moieties) have too high a crystallinity and/or too high viscosity for the end uses described herein. However urethane acrylates comprising mostly linking groups of Formula 2 (such as those UA represented by an analogy of Formula 1 where every $R^2$ represents an ethoxy moiety of Formula 2a) have been found to have insufficiently good properties for tenting applications. Therefore to have the desired performance the urethane acrylates of the present invention contain both type of linking groups (for example both caprolactone units of Formula 3a and ethoxy units of Formula 2a) as indicated in the proviso ($R^2$ represents both Formulae 2 & 3).

Examples of compounds and/or polymers of the invention are those derived from H(E/P)(M)A-polyethylene glycol, H(E/P)(M)A-polycaprolactone, H(E/P)(M)A-polypropylene glycol, H(E/P)(M)A-poly tetra methylene glycol (PTMG) and/or mixtures thereof. As used herein the term "H(E/P)(M)A" denotes the moieties: HEA (hydroxy ethyl acrylate), HEMA (hydroxy ethyl methacrylate), HPA (hydroxy propyl acrylate) and HPMA (hydroxy propyl methacrylate).

Advantageous materials of the invention are derivatives of H(E/P)(M)A-polyethylene glycol; and HE(M)A-polycaprolactone due to their balance of low cost and good properties. For example HE(M)A-polypropyleneglycol derivatives exhibit less good developing performance and whilst HE(M)A-poly tetra methylene glycol (PTMG) derivatives have excellent tenting properties, they are very expensive.

It is preferred that Formula 1 represents a polymer i.e. a polydisperse mixture of several compounds of Formula 1.

Preferred polymers of Formula 1 have a viscosity range of less than about 30,000 mPa·s, more preferably less than about 20,000 mPa·s, and most preferably less than about 12,000 mPa·s. It is an important optional advantage of the polymers of the invention that they can be treated easily at room temperature.

Preferred polymers of Formula 1 have a weight average molecular weight (Mw) of from about 3000 to about 6000 daltons as the applicant has found that polymers with a Mw of greater than 6000 are less good at developing performance and those with a Mw of lower than 3000 have a worsening tenting performance.

The term 'hydrocarbylene' as used herein denotes a divalent moiety (optionally attached to one or more other moieties) which consists of one or more hydrogen atoms and one or more carbon atoms the free valencies of which are not engaged in a double bond. A hydrocarbylene can be formed by removing two hydrogen atoms from a hydrocarbon (for example from an alkane to form an alkylene). The hydrocarbylene may comprise saturated carbon to carbon single bonds (e.g. in alkyl groups); unsaturated double and/or triple carbon to carbon bonds (e.g. in respectively alkenyl and alkynyl groups); aromatic groups (e.g. in aryl groups) and/or combinations thereof within the same moiety. Preferred hydrocarbylenes are alkylenes (which are biivalent and saturated).

For certain moieties herein the point(s) of attachment to the larger molecule or free valenc(ies) are indicated in the formulae by a free bond terminating in an asterisk.

The total number of certain atoms is specified for certain substituents for example $C_{1-x}$alkylene, signifies those alkylenes consisting of "1 to x" carbon atoms. A moiety which comprises a chain of three or more atoms such as $C_{>3}$hydrocarbylene or $C_{>3}$alkylene signifies a moiety in which the chain wholly or in part may be linear, branched and/or form a ring (including spiro and/or fused rings). Preferred hydrocarbylenes are linear or branched; more preferably linear.

Any radical group or moiety mentioned herein (e.g. as a substituent) may be a multivalent or a monovalent radical unless otherwise stated or the context clearly indicates otherwise (e.g. a bivalent hydrocarbylene moiety linking two other moieties). In any of the formulae herein if one or more substituents are not indicated as attached to any particular atom in a moiety (e.g. on a particular position along a chain and/or ring) the substituent may replace any H and/or may be located at any available position on the moiety which is chemically suitable and/or effective.

As used herein chemical terms (other than IUAPC names for specifically identified compounds) which comprise features which are given in parentheses—such as (alkyl)acrylate, (meth)acrylate and/or (co)polymer denote that that part in parentheses is optional as the context dictates, so for example the term (meth)acrylate denotes both methacrylate and acrylate.

Certain moieties, species, groups, repeat units, compounds, oligomers, polymers, materials, mixtures, compositions and/or formulations which comprise and/or are used in some or all of the invention as described herein may exist as one or more different forms such as any of those in the following non exhaustive list: stereoisomers (such as enantiomers (e.g. E and/or Z forms), diastereoisomers and/or geometric isomers); tautomers (e.g. keto and/or enol forms), conformers, salts, zwitterions, complexes (such as chelates, clathrates, crown compounds, cyptands/cryptades, inclusion compounds, intercalation compounds, interstitial compounds, ligand complexes, organometallic complexes, non stoichiometric complexes, π adducts, solvates and/or hydrates); isotopically substituted forms, polymeric configurations [such as homo or copolymers, random, graft and/or block polymers, linear and/or branched polymers (e.g. star and/or side branched), cross linked and/or networked polymers, polymers obtainable from di and/or tri valent repeat units, dendrimers, polymers of different tacticity (e.g. isotactic, syndiotactic or atactic polymers)]; polymorphs (such as interstitial forms, crystalline forms and/or amorphous forms), different phases, solid solutions; and/or combinations thereof and/or mixtures thereof where possible. The present invention comprises and/or uses all such forms which are effective as defined herein.

In a yet further aspect of the invention there is provided a process for preparing a urethane acrylate comprising the step of reacting together
(a) Component A comprising at least one C2-15hydrocarbyl diisocyanate isocyanurate;
(b) Component B comprising at least one compound of Formula 2b

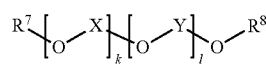

Formula 2b where X, Y, k and l are as given herein for Formula 2, and R7 and R8 are suitable (meth)acrylate groups which are optionally the same.
(c) Component C comprising at least one compound of Formula 3b

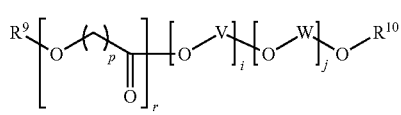

Formula 3b where V, W, i, j, p and r are as given herein for Formula 3, and R9 and R10 are suitable (meth)acrylate groups which are optionally the same to obtain a urethane acrylate of Formula 1 as described herein.

It will be appreciated that the meth(acrylate) groups in Formulae 2b and 3b are selected so they will react (under suitable conditions) with the isocyanate isocyanurate groups of Component A to form the urethane acrylates of Formula 1. Suitable methacrylate groups will be apparent to those skilled in the art and are largely selected from the most available cheap raw materials of Formulae 2b and 3b. Particularly suitable meth(acrylate) groups may be selected from hydroxy ethyl acrylate, hydroxy propyl acrylate; hydroxy ethyl methacrylate and hydroxy propyl methacrylate.

In a preferred process of the present invention Component A may comprises at least one $C_{2-10}$hydrocarbylene diisocyanate isocyanurate preferably a $C_{4-8}$alkylene diisocyanate isocyanurate and/or a $C_{6-8}$alkarylene diisocyanate isocyanurate.

In a preferred process of the present invention Component B may comprise at least one hydroxy$C_{1-4}$alkoxy(meth)acrylate-(caprolactone)$_n$, where the number of caprolactone units 'n' is given as for Formula 3a above, for example from 1 to 8, more conveniently from 1 to 5; most conveniently from 2 to 4.

In a preferred process of the present invention Component C may comprise at least one $(C_{1-4}$alkoxy$)_m$(meth)acrylate; where the number of alkoxy units 'm' is given as for Formula 2a above, for example from 2 to 12, more conveniently from 5 to 12; most conveniently from 6 to 10, especially 6, 8 and 10.

Examples of suitable Component A are isophorone diisocyanate (IPDI) isocyanurate; hexamethylene diisocyanate (HDI) isocyanurate; and/or tolylene diisocyanate (TDI) isocyanurate.

Examples of a suitable Component B are H(E/P)(M)A-(di, tri and tetra) caprolactones; for example: hydroxy ethyl acrylate di-caprolactone; hydroxy ethyl methacrylate dicaprolactone; hydroxy ethyl methacrylate tri-caprolactone and/or hydroxy ethyl methacrylate tetra caprolactone.

Examples of a suitable Component C are H(E/P)(M)A-polyethylene glycols, H(E/P)(M)A-polypropylene glycols, H(E/P)(M)A-poly tetra methylene glycols and mixtures thereof. Advantageously Component C may be a H(E/P)(M)A-polyethylene glycol such as hexylene glycol acrylate, hexylene glycol methacrylate, octylene glycol methacrylate and/or decylene glycol acrylate.

Components A, B & C may be reacted together simultaneously or they may be reacted together sequentially, for example Component C may be added to the reaction mixture part way during the reaction of Components A and B.

The process of the invention can be operated using any other suitable methods and equipment and optionally other ingredients may added to Components A, B and C as needed. For example the reaction may occur in presence of a suitable catalyst and/or initiator (such as dibutyl tin dilaurate and/or 3,5-dibutyl-4-hydroxy-toluene). Further features of the process are described in the examples.

The applicant has found that low viscosity urethane acrylates of Formula 1 can be usefully prepared when Component A is hexa(methylene) diisocyanate (HDI) isocyanurate or tolylene diisocyanate (TDI) isocyanurate which are both commonly available materials.

Unless the context clearly indicates otherwise, as used herein plural forms of the terms herein are to be construed as including the singular form and vice versa.

The term "comprising" as used herein will be understood to mean that the list following is non-exhaustive and may or may not include any other additional suitable items, for example one or more further feature(s), component(s), ingredient(s) and/or substituent(s) as appropriate.

The terms 'effective', 'acceptable' 'active' and/or 'suitable' (for example with reference to any process, use, method, application, preparation, product, material, formulation, compound, monomer, oligomer, polymer precursor, and/or polymers of the present invention and/or described herein as appropriate) will be understood to refer to those features of the invention which if used in the correct manner provide the required properties to that which they are added and/or incorporated to be of utility as described herein. Such utility may be direct for example where a material has the required properties for the aforementioned uses and/or indirect for example where a material has use as a synthetic intermediate and/or diagnostic tool in preparing other materials of direct utility. As used herein these terms also denote that a functional group is compatible with producing effective, acceptable, active and/or suitable end products.

A further aspect of the invention provides use of a urethane acrylate of the invention as described herein, as a flexibilizer, plasticizer and/or softener.

A still further aspect of the invention provides use of a urethane acrylate of the invention as described herein, in a method of tenting.

Many other variations embodiments of the invention will be apparent to those skilled in the art and such variations are contemplated within the broad scope of the present invention.

Further aspects of the invention and preferred features thereof are given in the claims herein.

EXAMPLES

The present invention will now be described in detail with reference to the following non limiting examples which are by way of illustration only.

The following abbreviations have been used herein
"HDI" denotes hexamethylene diisocyanate
"HEA" denotes 2-hydroxy ethyl acrylate
"HEMA" denotes 2-hydroxy ethyl methacrylate
"EO" denotes an ethoxy repeat unit
"IPDI" denotes Isophorone di-isocyanate
"THEIC" denotes 1,3,5-tris(hydroxyethyl)isocyanurate
"TDI" denotes tolylene diisocyanate
"DBT" denotes dibutyl tin dilaurate (a catalyst)
"DHT" denotes 3,5-dibutyl-4-hydroxy-toluene (an initiator)
"PMP" denotes para methoxyphenol.

The following ingredients are identified by chemical name and/or trade-name and name of manufacturer.

| Trade name | Chemical description | Manufacturer |
|---|---|---|
| Desmodur N3300 | HDI isocyanurate | Bayer |
| Sumidur N3300 | HDI isocyanurate | Sumika-Bayer |
| TKA 100P | HDI isocyanurate | Asahi-Kasei Chem. |
| Placcel FA2D | Polycaprolactone HEA, caprolactone × 2 | Daicel |
| Tone M100 | Polycaprolactone HEA, caprolactone × 2 | Dow |
| Placcel FM2D | Polycaprolactone HEMA, caprolactone × 2 | Daicel |
| Placcel FM3 | Polycaprolactone HEMA, caprolactone × 3 | Daicel |
| Placcel FM4 | Polycaprolactone HEMA, caprolactone × 4 | Daicel |

-continued

| Trade name | Chemical description | Manufacturer |
|---|---|---|
| Bisomer PEA-6 | Polyethylene glycol acrylate, EO × 6 | Cognis |
| Bisomer PEM6-LD | Polyethylene glycol methacrylate, EO × 6 | Cognis |
| Blemmer PE-350 | Polyethylene glycol methacrylate, EO × 8 | NOF |
| Blemmer AE-400 | Polyethylene glycol acrylate, EO × 10 | NOF |
| Vestant IPDI | IPDI | Degussa |
| Desmodur T-80 | TDI | Bayer |
| THEIC-PW | THEIC | Shikoku Kasei |
| CAPA 3091 | Polycaprolactone trimethylol propane, Mw 900 | Solvay |
| CAPA 2054 | Polycaprolactone diethylene glycol, Mw 550 | Solvay |

Preparation of Examples

Examples 1 to 6 of the present invention and comparative examples Comp I to IV are prepared using the basic method below. Refer to the following Table 1 for the type and amounts of certain ingredients indicated.

Basic Method

Reagent 'A' ('a' gram, NCO %='i') is weighed into a 1000 ml, separable flask with dibutyl tin dilaurate ('ii' g, 500 ppm) and 3,5-dibutyl-4-hydroxy-toluene ('iii' g, 100 ppm). A PTFE coated stirring blade is inserted in the flask's centre neck. To monitor the reaction temperature a thermocouple is inserted through one of the side necks of the flask and into the material. The other side neck is equipped with an Allihn condenser. Reagent 'B' ('b' g) is weighed into a 300 ml additional funnel equipped with a Teflon stopcock. The addition funnel containing Reagent 'B' is placed in the neck of flask and a slow drip is started. The flask is gradually heated to 60° C. The reaction temperature is kept under 63° C. As the reaction exotherm begins to die down, Reagent 'C' ('c' g) is weighed into a 500 ml addition funnel, which is placed in the neck of flask and a slow drip was started. The reaction temperature is kept under 63° C. during the slow drip. After the reaction exotherm died down, the flask is heated to 90° C. and the reaction is held at this temperature for 1 hour after which the NCO % is checked every hour until it reduced to <0.1%. Then p-methoxyphenol ('iv' g, 100 ppm) is added to reaction mixture, and the reaction temperature is cooled to 60° C. The material is then poured into dark polyethylene bottles.

Table 1 has the following notes to indicate where the basic method above is modified.

Note 'x' (Examples 5 & 6) After the addition of Reagent C is completed, the reaction is held at 60° C. for 2 hours, the NCO % is checked every hour until it reduces to <0.1% and then the p-methoxyphenol is added.

Note 'y' (Comp I) After the reaction exotherm begins to die down from the addition of Reagent B, the reaction is held at 60° C. for 2 hours, the NCO % is checked every hour until it reduces to <0.1% and then the p-methoxyphenol is added. The reaction mixture is agitated for 1 hour before it is stored and characterised.

TABLE 1

| | | | | | | | | ‘ii’/g | ‘iii’/g | ‘iv’/g |
|---|---|---|---|---|---|---|---|---|---|---|
| Example | Reagent A | ‘a’/g | ‘i’/ NCO % | Reagent B | ‘b’/g | Reagent C | ‘c’/g | DBT | DHT | PMP |
| Ex 1 | Desmodur N3300 | 328.18 | 22.07 | Placcel FM4 | 343.43 | Bisomer PEM6-LD | 427.13 | 0.55 | 0.11 | 0.11 |
| Ex 2 | Sumidur N3300 | 132.58 | 21.71 | Placcel FM4 | 132.99 | Blemmer PE-350 | 194.43 | 0.23 | 0.046 | 0.046 |
| Ex 3 | Sumidur N3300 | 181.15 | 21.71 | Placcel FM3 | 147.49 | Blemmer PE-350 | 271.06 | 0.30 | 0.06 | 0.06 |
| Ex 4 | Sumidur N3300 | 192.72 | 21.71 | Placcel FM2D | 120.39 | Blemmer PE-350 | 286.89 | 0.30 | 0.06 | 0.06 |
| Ex 5[x] | Desmodur N3300 | 198.45 | 21.8 | Tone M100 | 236.21 | Bisomer PEA-6 | 115.34 | 0.03 | 0.06 | 0.06 |
| Ex 6[x] | TKA 100P | 162.11 | 22.2 | Placcel FM3 | 271.19 | Blemmer AE-400 | 166.71 | 0.03 (50 ppm) | 0.06 | 0.06 |
| Comp I[′] | Sumidur N3300 | 137.07 | 21.71 | Placcel FA1DT | 162.93 | none | NA | 0.15 | 0.03 | 0.03 |
| Comp II | IPDI | 193.93 | 37.83 | Placcel FA2D | 300.11 | HEIC | 75.97 | 0.285 | 0.143 (250 ppm) | 0.029 (50 ppm) |
| Comp III | TDI | 176.63 | 48.27 | HEA | 117.37 | CAPA 3091 | 306.6 | 0.03 (50 ppm) | 0.15 (250 ppm) | 0.03 (50 ppm) |
| Comp IV | HDI | 129.73 | 50 | CAPA 2054 | 205.72 | Placcel FA2D | 264.91 | 0.03 (50 ppm) | 0.15 (250 ppm) | 0.03 (50 ppm) |

Characterisation of Examples

The material obtained from each example is characterised using conventional techniques and equipment. Viscosity is measured with a Brookfield Viscometer® model RVDV-E fitted with a small sample adapter. The viscosity (in mPa·s) is measured at 25° C. unless indicated otherwise. Gel permeation chromatography (GPC) is used to measure the weight average molecular weight ($M_w$) of the material in Daltons. The GPC is performed with a high performance liquid chromatograph from Tosoh Corp. in Japan, model HLC-8220GPC fitted with a TSK gel super HZM-N column, number F0010 and a polystyrene reference is used to calibrate this machine.

The viscosity and $M_w$ data are given in the following Table 2: Note that Comps II, III & IV are crystalline at room temperature.

TABLE 2

Properties of the Urethane (meth)acrylate examples

| Example | $M_w$/Daltons (on GPC, PST) | Viscosity/ mPa·s at 25° C. | Appearance |
|---|---|---|---|
| Ex 1 | 4907 | 10600 | Liquid |
| Ex 2 | 7530 | 26600 | Liquid |
| Ex 3 | 6700 | 20600 | Liquid |
| Ex 4 | 6331 | 21600 | Liquid |
| Ex 5 | 5477 | 23000 | Liquid |
| Ex 6 | 6020 | 11980 | Liquid |
| Comp I | 3641 | 69300 | Viscous liquid |
| Comp II | 5002 | 118000 (at 60° C.) | White wax |
| Comp III | 6184 | 99000 (at 60° C.) | White wax |
| Comp IV | 4873 | 1380 (at 60° C.) | White wax |

Each of the examples Ex 1 to Ex 6 can be advantageously used to prepare a flexibilizer of particular use in tenting applications.

The invention claimed is:

1. A urethane acrylate represented by Formula 1:

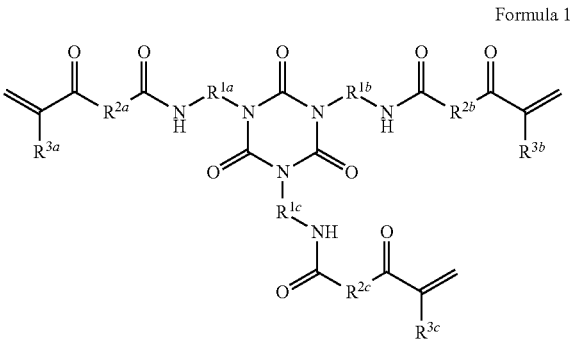

Formula 1 where $R^{1a}$, $R^{1b}$ and $R^{1c}$ each independently represent $C_{2-15}$hydrocarbylene;

$R^{2a}$, $R^{2b}$ and $R^{2c}$ each independently are selected from the group consisting of:

a divalent moiety of Formula 2

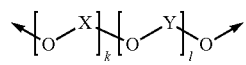

where X and Y independently represent $C_{2-10}$hydrocarbylene and k is from 0 to 30; l is from 0 to 30; and 'k+l' is from 1 to 30; and a divalent moiety of Formula 3

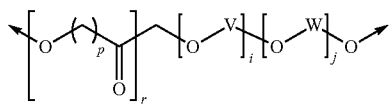

wherein V and W independently represent $C_{2-10}$hydrocarbylene; and
i is from 0 to 30; j is from 0 to 30; and 'i+j' is from 1 to 30;
p is from 1 to 10; and
r is from 1 to 10;
$R^{3a}$ $R^{3b}$ and $R^{3c}$ each independently represent H or methyl;
with the provisos that:
at least one of $R^{2a}$, $R^{2b}$ and $R^{2c}$ is a moiety of Formula 2;
at least one of $R^{2a}$, $R^{2b}$ and $R^{2c}$ is a moiety of Formula 3; and
wherein the sub-moiety

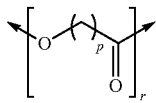

within Formula 3, is attached directly to the amide group in Formula 1.

2. A urethane acrylate as claimed in claim 1, in which $R^{1a}$, $R^{1b}$ and $R^{1c}$ each independently represent
a linear $C_{2-15}$alkylene, and/or a $C_{3-15}$hydrocarbylene comprising a cyclic ring;
$R^{2a}$, $R^{2b}$ and $R^{2c}$ each independently represent:
a moiety of Formula 2 where:
k is from 0 to 20; l is from 0 to 20 and 'k+l' is from 1 to 20; and/or
a moiety of Formula 3 where:
i is from 0 to 20; j is from 0 to 20, and 'i+j' is from 1 to 20; and
r is from 1 to 8; and p is from 3 to 6.

3. A urethane acrylate as claimed in claim 2, in which Formula 2 is a divalent moiety of Formula 2a

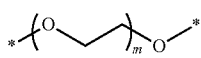

Formula 2a where m is from 2 to 12 and
Formula 3 is a divalent moiety of Formula 3a

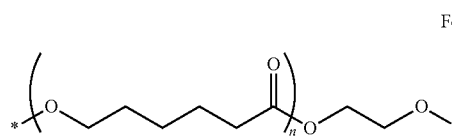

Formula 3a where n is from 1 to 8.

4. A urethane acrylate as claimed in claim 1, having a weight average molecular weight ($M_w$) of from about 3000 to about 6000 daltons.

5. A urethane acrylate as claimed in claim 1, having a viscosity of less than about 30,000 mPa·s.

6. A urethane acrylate as claimed in claim 5, having a viscosity of, less than about 20,000 mPa·s.

7. A urethane acrylate as claimed in claim 5, having a viscosity of, less than about 12,000 mPa·s.

8. A process for preparing a urethane acrylate as described in claim 1, the process comprising the step of reacting together
(a) Component A comprising at least one $C_{2-15}$hydrocarbyl diisocyanate isocyanurate;
(b) Component B comprising at least one compound of Formula 2b

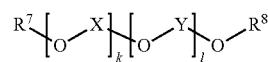

Formula 2b where X, Y, k and l are as denoted in claim 1 for Formula 2, and $R^7$ and $R^8$ are (meth)acrylate groups which are optionally the same;
(c) Component C comprising at least one compound of Formula 3b

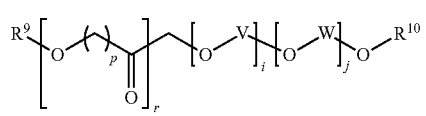

Formula 3b where V, W, i, j, p and r are as denoted in claim 1 for Formula 3, and $R^9$ and $R^{10}$ are (meth)acrylate groups which are optionally the same.

* * * * *

UNITED STATES PATENT AND TRADEMARK OFFICE
CERTIFICATE OF CORRECTION

PATENT NO. : 8,106,195 B2
APPLICATION NO. : 11/991503
DATED : January 31, 2012
INVENTOR(S) : Toru Konishi et al.

It is certified that error appears in the above-identified patent and that said Letters Patent is hereby corrected as shown below:

Column 8, lines 20-21, change "Compound B" to "Compound C".

Column 8, lines 25-26, change "Compound C" to "Compound B".

Column 8, line 34, change "Compound B" to "Compound C".

Column 8, line 39, change "Compound C" to "Compound B".

Column 8, line 42, change "Compound C" to "Compound B".

Column 10, line 39, change "Reagent 'B' ('b' g)" to "Reagent 'C' ('c' g)".

Column 10, line 41, change "Reagent 'B'" to "Reagent 'C'".

Column 10, line 44, change "Reagent 'C' ('c' g)" to "Reagent 'B' ('b' g)".

Column 10, line 57, change "Reagent C" to "Reagent B".

Column 10, line 63, change "Reagent B" to "Reagent C".

Columns 11-12, in the heading of Table 1, change "Reagent B" to "Reagent C".

Columns 11-12, in the heading of Table 1, change "Reagent C" to "Reagent B".

Columns 11-12, in the heading of Table 1, change "'b'/g" to "'c'/g".

Columns 11-12, in the heading of Table 1, change "'c'/g" to "'b'/g".

Signed and Sealed this
First Day of May, 2012

David J. Kappos
*Director of the United States Patent and Trademark Office*